United States Patent
Yang et al.

(10) Patent No.: US 6,420,092 B1
(45) Date of Patent: Jul. 16, 2002

(54) LOW DIELECTRIC CONSTANT NANOTUBE

(76) Inventors: Cheng-Jer Yang, No. 49, Lung-Nan Rd., Ping-Chen, Taoyuan Hsien; Fu-Kuo Tan-Tai, 9F-3, No. 13, Lane 125, Hsi-Tsang Rd., Wan-Hua District, Taipei; Huang-Chung Cheng, 2F, No. 7, Alley 1, Lane 182, Tung-Cheng St., East District, Tainan, all of (TW)

( * ) Notice: Subject to any disclaimer, the term of this patent is extended or adjusted under 35 U.S.C. 154(b) by 0 days.

(21) Appl. No.: 09/417,331

(22) Filed: Oct. 13, 1999

(30) Foreign Application Priority Data

Jul. 14, 1999 (TW) .................................... 88111924

(51) Int. Cl.[7] .............................. H01J 9/02; B32B 9/00
(52) U.S. Cl. ..................... 430/311; 430/313; 430/315; 430/318; 427/249.15; 427/255.18; 427/255.394; 427/255.395
(58) Field of Search ................................ 430/311, 313, 430/314, 315, 318, 335; 427/530, 560, 569, 585, 590, 595, 249.15, 255.18, 255.394, 255.395

(56) References Cited

U.S. PATENT DOCUMENTS

| | | | | |
|---|---|---|---|---|
| 4,992,299 A | * | 2/1991 | Hochberg et al. | 427/38 |
| 5,789,024 A | * | 8/1998 | Levy et al. | 427/244 |
| 5,973,444 A | * | 10/1999 | Xu et al. | 313/309 |
| 6,030,666 A | * | 2/2000 | Lam et al. | 427/539 |
| 6,063,243 A | * | 5/2000 | Zettl et al. | 204/164 |
| 6,143,412 A | * | 7/2000 | Schueller et al. | 428/408 |
| 6,146,227 A | * | 7/2000 | Mancevski | 445/24 |
| 6,156,256 A | * | 12/2000 | Kennel | 264/461 |
| 6,181,013 B1 | * | 1/2001 | Liu et al. | 257/762 |
| 6,194,128 B1 | * | 2/2001 | Tao et al. | 430/313 |
| 6,277,318 B1 | * | 8/2001 | Bower et al. | 264/346 |
| 6,286,226 B1 | * | 9/2001 | Jin | 33/706 |
| 6,297,592 B1 | * | 10/2001 | Goren et al. | 315/3.5 |

* cited by examiner

Primary Examiner—Janet Baxter
Assistant Examiner—Amanda C. Walke
(74) Attorney, Agent, or Firm—J.C. Patents

(57) ABSTRACT

A low dielectric constant nanotube, which can be used in the damascene process, and the fabrication method for a non-selective and a selective nanotube thin film layer are described. The non-selective deposition of the nanotube thin film layer includes forming a catalytic layer on the substrate followed by chemical vapor depositing a nanotube thin film layer on the catalytic layer. The selective deposition of the nanotube thin film layer includes forming a catalytic layer on the substrate followed by patterning the catalytic layer. A patterned photoresist layer can also form on the substrate, followed by forming multiple of catalytic layers on the photoresist layer and on the exposed substrate respectively. The photoresist layer and the overlying catalytic layer are removed. Thereafter, a nanotube layer is formed on the patterned catalytic layer by chemical vapor deposition. A conformal barrier layer can further form on the substrate followed by filling the openings of the nanotube on the substrate with a metal conductive layer and conducting a damascene process.

42 Claims, 5 Drawing Sheets

LOW DIELECTRIC CONSTANT NANOTUBE

CROSS-REFERENCE TO RELATED APPLICATION

This application claims the priority benefit of Taiwan application serial no. 88111924, filed Jul. 14, 1999, the full disclosure of which is incorporated herein by reference.

BACKGROUND OF THE INVENTION

1. Field of the Invention

The present invention relates to a fabrication method for a dielectric material with a low dielectric constant. More particularly, the present invention relates to a fabrication method of a low dielectric constant nanotube, which can be used in a damascene process.

2. Description of the Related Art

As the semiconductor technology enters the deep sub-micron territory, the device density continues to increase. As a result, in the design for the multi-level metal interconnects, the continuous increase of the metal conductive layer causes a RC delay in the signal transmission between the metal interconnects and becomes the major factor limiting the transmission speed of the device. To reduce the time delay in the signal transmission, a low resistance material and a low capacitance material are being produced. Since a capacitance is directly proportional to the dielectric constant of the dielectric material, the research and development of materials with a low dielectric constant is the current trend in the semiconductor industry.

The low dielectric constant materials in general can be divided into inorganic and organic type of compounds. The most commonly known low dielectric inorganic material includes fluorine-doped silicon glass (FSG), hydrogen silesquioxiane (HSQ) and methyl sequioxane (MSQ). The fluorine concentration in FSG is difficult to control and, hence, easily leading to moisture absorption and an increase of the dielectric constant. A metal plug poisoning is likely to occur in the subsequent metal plug formation, resulting in an extremely high contact resistance. Since the HSQ consists of hydroxyl (OH) groups in its chemical structure, it absorbs moisture readily, causing a current leakage and an increase of the dielectric constant. To correct the hygroscopic property of the HSQ, the hydroxyl groups (OH) are often replaced with the methyl groups ($CH_3$). The problem of hygroscopicity is resolved by the replacement with the methyl groups; however, the thermal stability is still limited.

In order to increase the speed of signal transmission, besides using a low dielectric constant material for the inner metal dielectric layer, it has become popular to use a low resistance copper for the conductive line. However, various issues arise in the dry etching of copper. For example, if the free radicals of the organic molecules are used to dry etch the copper, the free radicals from the organic molecules easily polymerize to form high molecular weight molecules and adhere on the copper surface, which would interfere the etching process. If ligand molecules, such as 1,1,1,5,5,5-hexafluoroacetylacetonate (hfac) which forms a volatile complex molecule with copper, is used to etch the copper, the etching reaction and the chemical vapor deposition reaction of copper are the forward and the reverse reactions. During the etching of copper is thereby often accompanied by the deposition of copper. If the reversible reaction is not in equilibrium and the ligand molecules are more reactive with copper, an undercut is formed in the underlying copper of the photoresist. Even when the temperature is raised to increase the volatility of the copper-ligand complex molecule, the dielectric layer can be easily damaged if the dielectric layer is a thermally unstable organic low dielectric constant material. It is, therefore, damascening is still the major approach in the copper conductive line technology.

SUMMARY OF THE INVENTION

The present invention provides a fabrication method for a non-selective nanotube thin film layer. The method includes forming a catalytic layer on the substrate followed by the formation of a nanotube layer on the catalytic layer by chemical vapor deposition.

The present invention provides a fabrication method for a selective nanotube thin film layer. The method includes forming a catalytic layer on the substrate followed by patterning the catalytic layer. A nanotube layer is then formed on the patterned catalytic layer by chemical vapor deposition.

The present invention provides another fabrication method for a selective nanotube thin film layer. This method includes forming a patterned photoresist layer on the substrate, followed by the formation of multiple catalytic layers on the photoresist layer and on the exposed substrate respectively. The photoresist layer and its overlying catalytic layer are then removed to form a nanotube layer on the remaining catalytic layer on the substrate by chemical vapor deposition.

The present invention provides a damascene process performed on a nanotube. The method includes the formation of a catalytic layer on the substrate, followed by patterning the catalytic layer. A nanotube layer is formed on the patterned catalytic layer by chemical vapor deposition. A conformal barrier layer is then formed on the substrate, followed by filling the openings in the nanotube layer on the substrate with a metal conductive layer.

The present invention provides another damascene process conducted on a nanotube layer. The method includes forming a patterned photoresist layer on the substrate followed by forming multiple catalytic layers on the photoresist layer and on the exposed substrate respectively. The photoresist layer and its overlying catalytic layer are removed. A nanotube layer is then formed on the remaining catalytic layer on the substrate by chemical vapor deposition. Thereafter, a conformal barrier layer is formed on the substrate, followed by filling the openings in the nanotube layer on the substrate with a metal conductive layer.

The materials for the above substrate includes single crystal silicon, III–V groups semiconductors, glass or quartz. The catalytic layer includes iron, colbalt, nickel, gold or platinum types of metal. Materials for the nanotube layer include carbon or boron nitride. The carbon nanotube is formed by chemical vapor deposition using the deposition gases of hydrocarbon compound/$H_2$/nitride containing compound/$SiH_4$ at the approximated flow rates of 16–24 sccm, 64–96 sccm, 64–96 sccm and 3–5 sccm respectively. The gas sources of the chemical vapor deposition process for the boron nitride nanotube include $B_2H_6/N_2$, $B_2H_6/NH_3$ or $B(OCH_3)_3/N_2/H_2$.

According to the present invention, using a nanotube for a dielectric layer results in low dielectric constant because of the existence of pores throughout the structure of the nanotube. The nanotube also has good thermal stability because it does not absorb moisture easily due to the low polarity of the nanotube wall. The formation of the dielectric layer with a nanotube therefore stabilizes the quality of the dielectric layer. In addition, a nanotube dielectric layer can be directly formed by patterning a catalytic layer or by forming a catalytic layer on a patterned photoresist layer and on a substrate, followed by removing the photoresist layer and its overlying catalytic layer. The patterned nanotube layer can also be used for the damascene process, which is highly beneficial in the manufacturing of a copper conductive line. Especially using the patterned photoresist layer to directly form a patterned nanotube layer followed by a damascene process, multiple metalizing processes can be conducted without any etching of the dielectric layer or the metal.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT (Preferred Embodiment 1)

Figure 1A:
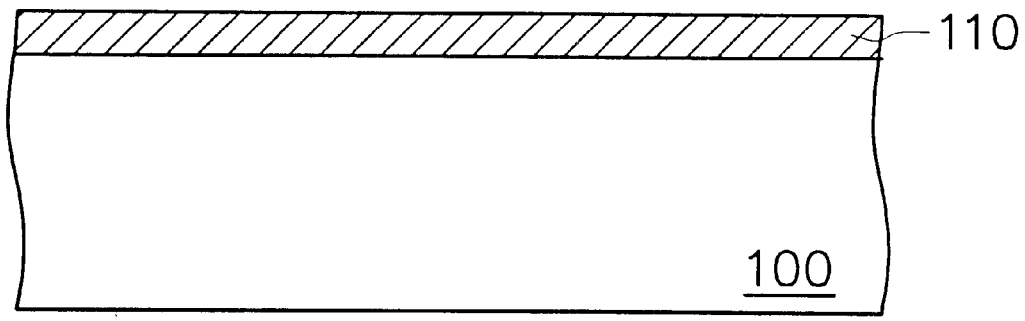
FIGS. 1A to 1B are schematic, cross-sectional views of a non-selective nanotube showing the thin film deposition process according to a preferred embodiment of the present invention.
Figure 1B:
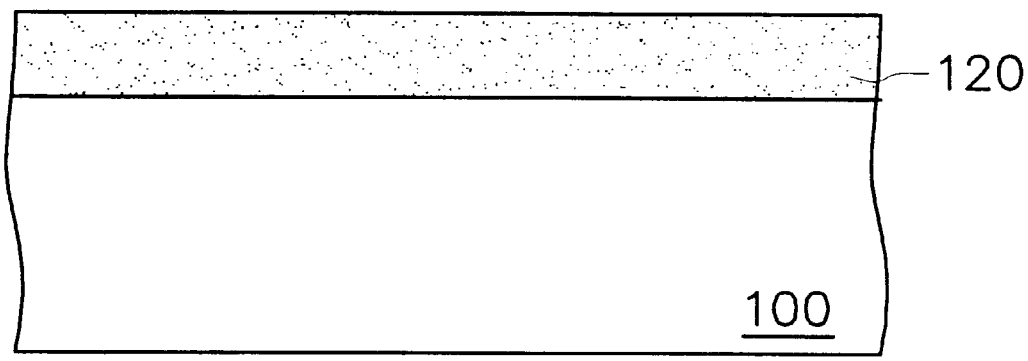

FIGS. 1A to 1B are schematic, cross-sectional views of a non-selective nanotube showing the thin film deposition process according to a preferred embodiment of the present invention.

Referring to FIG. 1A, a catalytic layer 110 is formed on the substrate 100. The substrate 100 includes single crystal silicon, III–V group semiconductors, glass or quartz, wherein the III–V group semiconductors include the gallium-arsenic (Ga—As) semiconductor. The catalytic layer 110, including iron, cobalt, nickel, gold or platinum, is formed by, for example, sputtering deposition, electron beam evaporation. The catalytic layer 110 can also be formed by a soluble salt solution of iron, cobalt, nickel, gold or platinum, for example, ferric nitride $Fe(NO_3)_3$, cobalt iodide ($CoI_2$), gold trichloride ($AuCl_3$), using a sol-gel or a coating method followed by a thermal treatment.

Since the catalytic layer 110 is mostly metal material, the surface of the catalytic layer is easily oxidized to form a thin oxide layer when in contact with air. As a result, a cleaning-up of the oxide material and other contaminant on the surface of the catalytic layer is needed (not shown in graph), which includes using hydrogen plasma or argon plasma. If hydrogen plasma is used, the flow rate for the hydrogen gas is preferably between 1000 to 2400 sccm and the microwave power is approximately 0.8 to 1.2 Kwatt.

As shown in FIG. 1B, a nanotube thin film layer 120 is formed on the substrate 100 surface. During the formation of the nanotube thin film layer 120, the catalytic layer 110 gradually spreads to the tip of the nanotube along the growing of the nanotube wall, and finally enters the gaseous environment outside the nanotube thin film layer 120. As a result, the catalytic layer 110 eventually disappears.

The nanotube thin film layer 120 is formed by, for example, hot chemical vapor deposition, microwave chemical vapor deposition, hot filament chemical vapor deposition, arc chemical vapor deposition, plasma enhanced chemical vapor deposition or electron cyclotron resonance chemical vapor deposition. The type of the reaction gas used depends on the types of the nanotube.

To form a carbon nanotube, for example, the reaction gas includes hydrocarbon compound/$H_2$/nitride containing compound/$SiH_4$ at flow rates of 16–24 sccm, 64–96 sccm, 64–96 sccm and 3 to 5 sccm respectively. The hydrocarbon compound includes $CH_4$, $C_2H_4$, $C_2H_2$ or their combinations. The nitride containing compound includes $N_2$, $NH_3$ or their combinations. The total pressure for the reaction chamber is maintained around 20 to 50 torr and the reaction gas includes $CH_3NH_2$/$H_2$/$SiH_4$. If the carbon nanotube is formed by microwave chemical vapor deposition, the microwave power is approximately between 300 to 2000 Watt. If a born nitride (BN) nanotube is formed, the reaction gas can be $B_2H_6$/$N_2$, $B_2H_6$/$NH_3$ or $B(OCH_3)_3$/$N_2$/$H_2$.

Strengthening the nanotube thin film layer 120 and increasing its stability can be achieved by annealing in $N_2$, $NH_3$, NO, $N_2O$, $H_2$ or the combinations of these gases at a temperature of between 250 to 450° C. If the gas used for the annealing process is an oxidizer, such as NO or $N_2O$, the temperature then needs to be lower to prevent the nanotube from being oxidized and burned off at a high temperature.

In addition, the mechanical strength of a carbon nanotube can be improved by the formation of a layer of boron nitride on the wall surface of the carbon nanotube. The formation of the boron nitride layer includes depositing a boron nitride layer on the carbon nanotube surface by chemical vapor deposition or sputtering deposition after completing the formation of the carbon nanotube (nanotube thin film layer 120).

To further reduce the dielectric constant of the nanotube thin film layer 120, the fluorine ion can be implanted in the nanotube thin film layer 120 before the annealing process. The source of the fluorine ion includes $F^-$, $BF^{2+}$ or their combinations.

(Preferred Embodiment 2)

FIGS. 2A to 2D are schematic, cross-sectional views of a selective nanotube showing the thin film deposition process according to another preferred embodiment of the present invention.

Figure 2A:
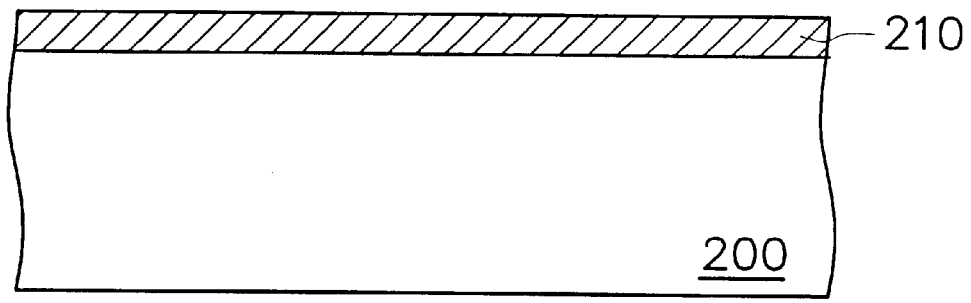
FIGS. 2A to 2D are schematic, cross-sectional views of a selective nanotube showing the thin film deposition process according to another preferred embodiment of the present invention.

As shown in FIG. 2A, a catalytic layer 210 is formed on the substrate 200. Similar to the preferred embodiment 1, the substrate 200 includes single crystal silicon, III–V group semiconductor, glass or quartz, wherein the III–V group semiconductor such as the gallium-arsenic (Ga—As) semiconductor. The catalytic layer 210, including iron, cobalt, nickel, gold or platinum, is formed by, for example, physical vapor deposition or chemical vapor depostion. The catalytic layer 210, further including the soluble salt solution of iron, cobalt, nickel, gold or platinum, for example ferric nitrite ($Fe(NO_3)_3$), cobalt iodide ($CoI_2$), gold trichloride ($AuCl_3$), is formed by a sol-gel or a coating method followed by a thermal treatment.

Figure 2B:
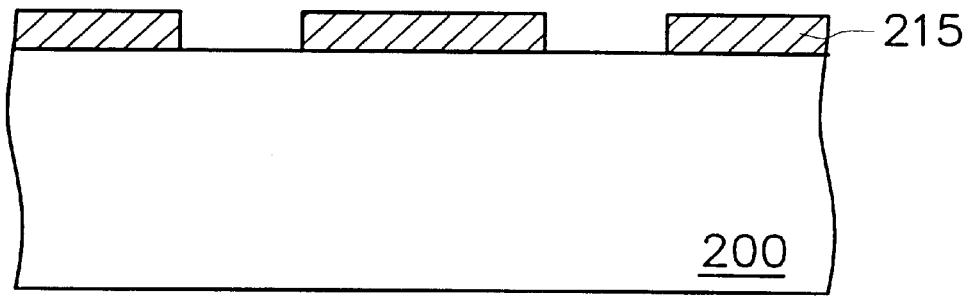

As shown in FIG. 2B, the catalytic layer 210 is patterned, for example, by photolithography and etching to form the patterned catalytic layer 215. The catalytic layer 210 is etched by, for example, reactive ion etching (RIE) using a chlorine containing gas as the etching plasma gas source to form a volatile metal chloride. The catalytic layer 210 can also be etched by wet etching, for examples, using a HCl/$H_2O_2$/$H_2O$ solution (commercially known as RCA SC2) at a ratio of 1:1:6.

Thereafter, a cleaning-up of the oxide material and the contaminant (not shown in graph) is performed on the catalytic layer surface. The cleaning-up includes using hydrogen plasma or argon plasma. If hydrogen plasma is used, the flow rate for the hydrogen gas is preferably between 1000 to 2400 sccm and the microwave power is approximately 0.8 to 1.2 kwatt.

Figure 2C:
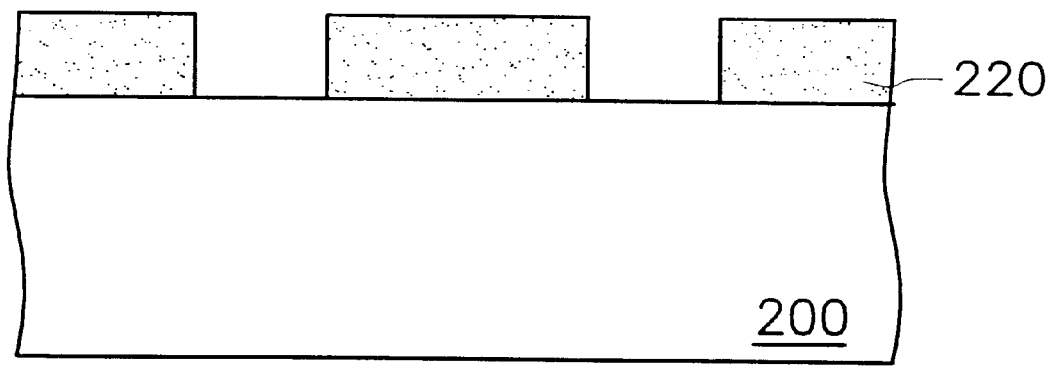

According to FIG. 2C, a patterned nanotube thin film layer 220 is formed on the surface of the catalytic layer 215. During the formation of the nanotube thin film layer 220, the patterned catalytic layer gradually spreads to the tip of the nanotube along the growing of the nanotube wall, and eventually enters the gaseous environment outside the nanotube thin film layer 220. As a result, the catalytic layer 215 eventually disappears. Since the catalytic layer 215 is already patterned and the growing of the nanotube thin film layer 220 relies on the catalytic layer 215, the nanotube thin film layer 220 is therefore also patterned. The method and the conditions for growing the nanotube thin film layer 220 are similar to those in Embodiment 1.

Strengthening the nanotube thin film layer 220 and increasing its stability can be achieved by an annealing in $N_2$, $NH_3$, NO, $N_2O$, $H_2$ or the combinations of these gases at a temperature between 250 to 450° C. If the gas used for the annealing process is an oxidizer, such as NO or $N_2O$, the annealing temperature needs to be lower to prevent the nanotube from being oxidized and burnt off.

Furthermore, a layer of boron nitride can be formed on the tube wall surface of the carbon nanotube to further increase the mechanical strength of the nanotube. The formation of the boron nitride layer includes a deposition of a boron nitride layer on the carbon nanotube surface by chemical vapor deposition or sputtering deposition after the formation of the carbon nanotube (nanotube thin film layer 220).

To further reduce the dielectric constant of the nanotube thin film layer 220, fluorine ion can be implanted in the nanotube thin film layer 120 and 220 before the annealing process. The source of fluorine ion includes $F^-$, $BF^{2+}$ or their combinations.

Figure 2D:
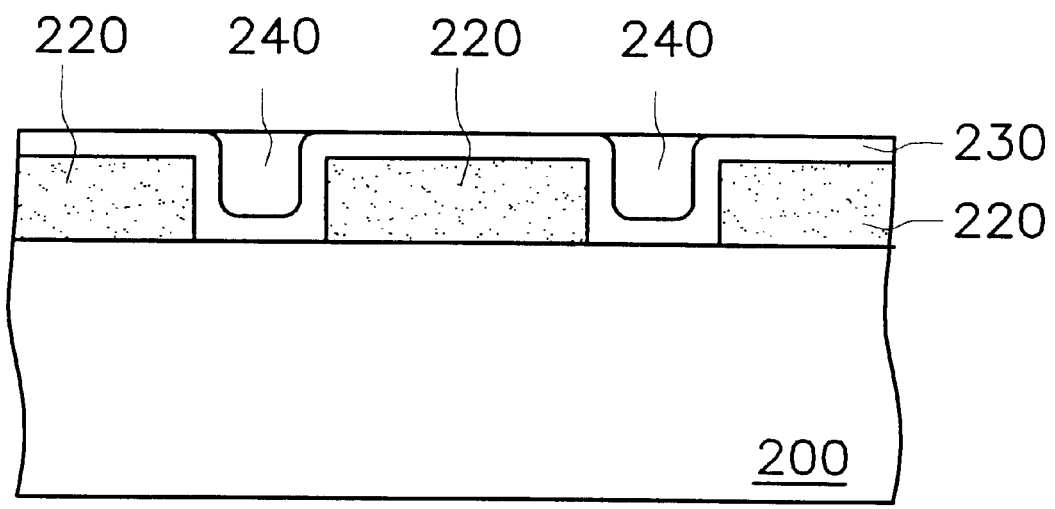

As shown in FIG. 2D, a conformal barrier layer 230 is formed on the substrate 200 and the nanotube thin film layer 220, followed by forming a metal layer. The part of the metal layer that is higher than the barrier layer 230 is then removed to form the metal line 240, or both the metal layer and the barrier layer 230 above the substrate are removed to form the metal line 240. In the present embodiment, only the metal layer that is higher tan the barrier is removed.

The barrier layer 230, such as Ti/TiN, Ta/TaN and WN, is formed by, for example, sputtering deposition. The metal layer, including aluminum, copper, aluminum/copper alloy, or tungsten, is formed by sputtering deposition or chemical vapor deposition. The removal of the part of the metal layer that is higher than the barrier layer 230 includes chemical mechanical polishing or etching-back.

(Preferred Embodiment 3)

FIGS. 3A to 3D are schematic, cross-sectional views showing the progression of a damascene process according to another preferred embodiment of the present invention.

Figure 3A:
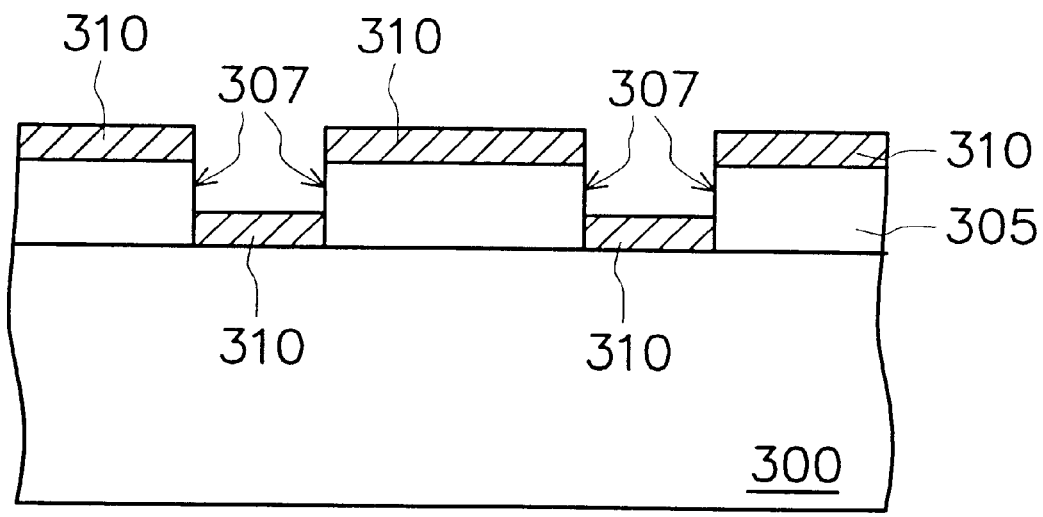
FIGS. 3A to 3D are schematic, cross-sectional views showing the progression of a damascene process according to a preferred embodiment of the present invention.

Referring to FIG. 3A, a patterned photoresist layer 305 is formed on the substrate 300. A catalytic layer 310 is then formed on the substrate 300 and the photoresist layer 305.

Similar to the preferred embodiment 1, the substrate 300 includes single crystal silicon, III–V group semiconductor, glass or quart, wherein the III–V semiconductor includes the gallium-arsenic (Ga—As) semiconductor. The patterned photoresist layer 305 is formed by, for example, spin coating a layer of photoresist followed by patterning with the photolithography technique. The catalytic layer 310, including iron, cobalt, nickel, gold or platinum, is formed by, for example, physical vapor deposition or chemical vapor deposition. It is also preferred to use a deposition method with an ion bombardment effect to etch the sidewall 307 of the photoresist layer 305 without the deposition of the catalytic layer 310. The catalytic layer 310 can also be formed by the soluble salt solutions of iron, cobalt, nickel, gold or platinum, for example $Fe(NO_3)_3$, cobalt iodide ($CoI_2$), gold trichloride ($AuCl_3$), using a sol-gel or a coating method followed by a thermal treatment. The catalytic layer 310, formed by the soluble salt solution of metal such as iron, cobalt, nickel, gold or platinum, is thicker at the depression between the photoresist layers 305 and is thinner at other areas. The reason for such an occurrence is because the precursor for the catalytic layer 310 is a metal soluble salt solution.

Figure 3B:
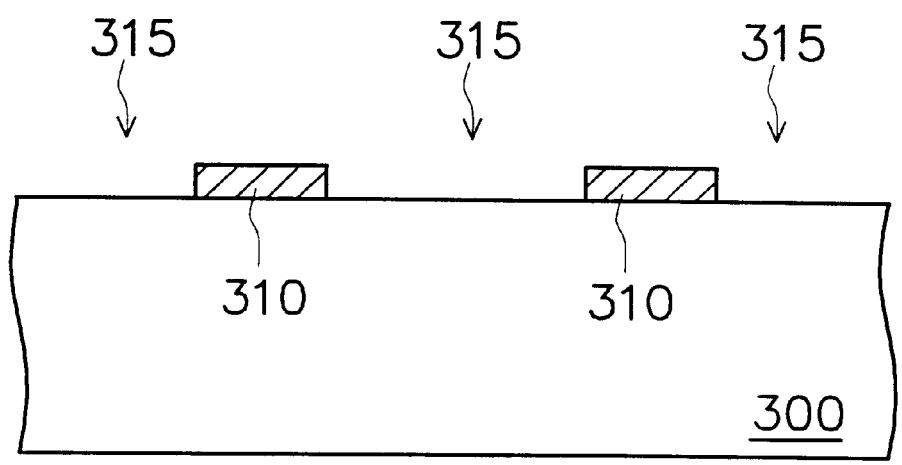

As shown in FIG. 3B, the photoresist layer 305 and the overlying catalytic layer 310 are removed, leaving only the patterned catalytic layers 310 and the openings 315 between the adjacent catalytic layers 310. The photoresist layer 305 is removed by, for example, a lift-off method in which the substrate is 300 is submerged in a solvent that can dissolve the photoresist layer 305 such as acetone followed by a removal of the dissolved photoresist layer 305 by sonication.

Figure 3C:
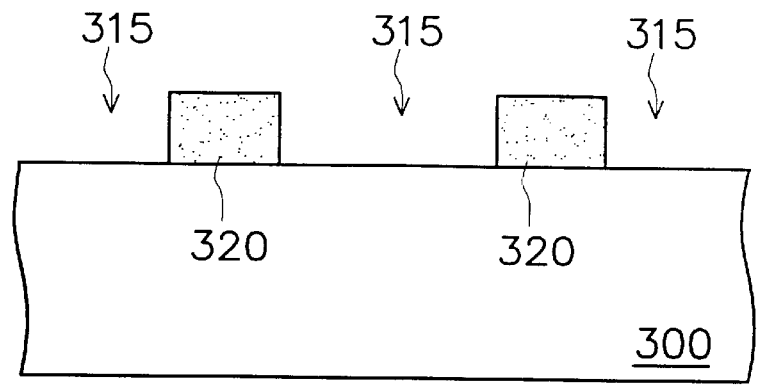

Referring to FIG. 3C, a patterned nanotube thin film layer 320 is formed on the surface of the catalytic layer 310. During the formation of the nanotube thin film layer 320, the patterned catalytic layer 310 gradually spreads to the tip of the nanotube grows along growing of the nanotube wall, and finally enters the gaseous environment outside the nanotube thin film layer 320. The patterned catalytic layer 310 thereby eventually disappears. Since the catalytic layer 310 is already patterned and the growing of the nanotube thin film layer 320 relies on the catalytic layer 310, the nanotube thin film layer 320 is also patterned. The method and the conditions for growing the nanotube thin film layer 320 are similar to those in Embodiment 1.

To further strengthen the nanotube thin film layer 220 and to increase its stability can be achieved by annealing in $N_2$, $NH_3$, NO, $N_2O$, $H_2$ or combinations of these gases at a temperature between 250 to 450° C. If the gas used for the annealing process is an oxidizer, such as NO or $N_2O$, the annealing temperature needs to be lower to prevent the nanotube from being oxidized and burned off at a high temperature.

In addition, the mechanical strength of a carbon nanotube can be improved by the formation of a layer of boron nitride on the wall surface of the carbon nanotube. The formation of the boron nitride layer includes a deposition of a boron nitride layer on the carbon nanotube surface by chemical vapor deposition or sputtering deposition after the formation of the carbon nanotube (nanotube thin film layer 320).

To further reduce the dielectric constant of the nanotube thin film layer 320, the fluorine ion is implanted in the nanotube thin film layer 320 before the annealing process. The source of the fluorine ion includes $F^-$, $BF^{2+}$ or their combination.

Figure 3D:
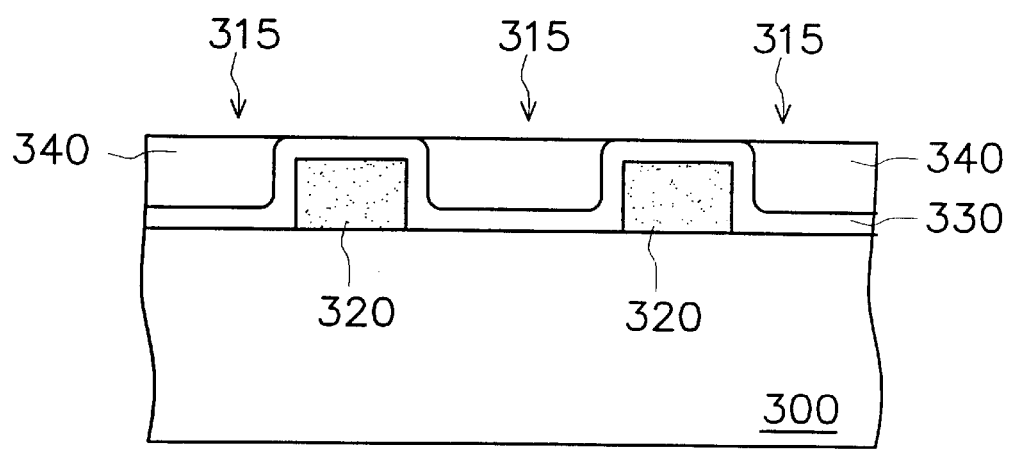

As shown in FIG. 3D, a conformal barrier layer 330 is formed on the substrate 300 and the nanotube thin film layer 320 followed by forming a metal layer. The part of the metal layer that is higher than the barrier layer 330 is removed to form a metal line 340 or both the metal layer and the barrier layer 330 above the substrate are removed to form the metal line. In the present preferred embodiment, the metal layer that is higher than the barrier layer is removed.

The barrier layer 330, such as Ti/TiN, Ta/TaN and WN, is formed by, for example, sputtering deposition. The metal layer, including aluminum, copper, aluminum/copper alloy, or tungsten, is formed by sputtering deposition or chemical vapor deposition. The removal of the part of the metal layer that is higher than the barrier layer 330 includes chemical mechanical polishing or etching-back.

According to the Raman spectra of the carbon nanotube formed in the above embodiments, the vibrational frequency occurs at approximately 1334 and 1576 $cm^{-1}$. The Raman vibrational frequency of the carbon nanotube, formed by using graphite as a target or an electrode, is at approximately 1350 and 1590 $cm^{-1}$, (Yudasaka et. Al., Chemical Physics Letter, 278:102, 1997), indicating an existence similar to the graphite-like amorphous carbon and suggesting there are still structural differences of the carbon nanotube formed according to the present invention. In addition, the carbon nanotube of the present invention contains nitrogen.

Based on the above embodiments, the present invention comprises at least the following advantages. The nanotube is an excellent candidate for a low dielectric constant material because the nanotube is highly porous hence the dielectric constant is lower. Implanting the fluorine ion can further lower the dielectric constant of the nanotube thin film layer. The carbon nanotube and the boron nitride nanotube formed according to the above embodiments have good thermal stability and non-hygroscopic. The dielectric constant, therefore, will not increase and the quality of the dielectric layer is stable. Based on Embodiment 2 and Embodiment 3, a patterned catalytic layer can be used to directly form a patterned nanotube thin film layer. According to Embodiment 3, only photolithography is needed to pattern the photoresist layer. As a result, a patterned nanotube thin film layer is formed without the etching process. According to Embodiment 2 and Embodiment 3, the patterned nanotube thin film layer can be used for the damascene process to form the patterned metal line, avoiding the etching of metal. This is especially useful in the formation of a copper conductive line.

It is to be understood that both the foregoing general description and the following detailed description are exemplary, and are intended to provide further explanation of the invention as claimed.

What is claimed is:

1. A fabrication method for a nanotube layer comprising the steps of:
   providing a substrate;
   forming a catalytic layer on the substrate;
   cleaning-up a surface of the catalytic layer; and
   forming a nanotube layer on the catalytic layer by chemical vapor deposition, wherein the nanotube layer is formed by reaction gases of hydrocarbon compound, $H_2$, nitride containing compound, and $SiH_4$.

2. The fabrication method for a nanotube layer according to claim 1, wherein the substrate is a material selected from the group consisting of single crystal silicon, III–V group semiconductor, glass, and quartz.

3. The fabrication method for a nanotube layer according to claim 1, wherein the formation of the catalytic layer is by a method selected from the group consisting of sputtering deposition, beam evaporation, sol-gel and coating.

4. The fabrication method for a nanotube layer according to claim 1, wherein the catalytic layer includes a metal and the metal is a material selected from the group consisting of iron, cobalt, nickel, gold, platinum, and their metal ions.

5. The fabrication method for a nanotube layer according to claim 1, wherein the cleaning-up step includes conducting hydrogen plasma at a flow rate of approximately 1000 to 24000 sccm, with a microwave power of approximately 0.8 to 1.2 kwatt.

6. The fabrication method for a nanotube layer according to claim 1, wherein the cleaning-up step includes using argon plasma.

7. The fabrication method for a nanotube layer according to claim 1, wherein the chemical vapor deposition is a process selected from the group consisting of microwave chemical vapor deposition, hot filament chemical vapor deposition, plasma enhanced chemical vapor deposition, and electron cyclotron resonance chemical vapor deposition.

8. The fabrication method for a nanotube according to claim 7, wherein a microwave power for the microwave chemical vapor deposition is approximately 300 to 2000 watt.

9. The fabrication method for a nanotube according to claim 1, wherein the nanotube layer includes a carbon nanotube layer.

10. The fabrication method for a nanotube according to claim 9, wherein reaction gases to form the carbon nanotube layer includes a hydrocarbon compound, $H_2$, a nitride containing compound and $SiH_4$ at flow rates of 16 to 24 sccm, 64 to 96 sccm, 64 to 96 sccm and 3 to 5 sccm respectively.

11. The fabrication method for a nanotube according to claim 10, wherein the hydrocarbon compound is selected from the group consisting of $CH_4$, $C_2H_4$, $C_2H_2$, and their combinations.

12. The fabrication method for a nanotube layer according to claim 10, wherein the nitride compound is selected from the group consisting of $N_2$, $NH_3$, and their combinations.

13. The fabrication method for a nanotube layer according to claim 9, wherein reaction gases for forming the carbon nanotube include $CH_3NH_2$, $H_2$ and $SiH_4$.

14. The fabrication method for a nanotube layer according to claim 9, further comprising, after the formation of the carbon nanotube layer, depositing a boron nitride layer on a tube wall surface of the carbon nanotube by chemical vapor deposition.

15. The fabrication method for a nanotube layer according to claim 9, further comprising, after the formation of the carbon nanotube layer, depositing a boron nitride layer on the tube wall surface of the carbon nanotube by sputtering deposition.

16. The fabrication method for a nanotube layer according to claim 1, wherein the nanotube layer includes a boron nitride nanotube layer.

17. The fabrication method for a nanotube layer according to claim 16, wherein a reaction gas for forming the boron nitride nanotube layer is selected from the group consisting of $B_2H_6/N_2$, $B_2H_6/NH_3$ and $B(OCH_3)_3/N_2/H_2$.

18. The fabrication method for a nanotube layer according to claim 1, further comprising, after the formation of the nanotube layer, conducting an annealing process.

19. The fabrication method for a nanotube layer according to claim 18, wherein a gas used in the annealing process is selected from the group consisting of $N_2$, $NH_3$, NO, $N_2O$, and $H_2$.

20. The fabrication method for a nanotube layer according to claim 18, between steps of forming the nanotube layer and annealing, further including a step of implanting a fluorine ion.

21. The fabrication method for a nanotube layer according to claim 20, wherein a source of the fluorine ion for the fluorine ion implantation is selected from the group consisting of $F^-$, $BF^{2+}$, and their combinations.

22. The fabrication method for a nanotube layer according to claim 1, wherein between steps of forming the catalytic layer and conducting the cleaning-up further includes a step of patterning the catalytic layer.

23. A fabrication method for a selective nanotube layer comprising the steps of:
   providing a substrate;
   forming a patterned photoresist layer on the substrate;
   forming a plurality of catalytic layers on the photoresist layer and an exposed portion of the substrate respectively,
   removing the photoresist layer and an overlying catalytic layer, leaving a plurality of openings on the substrate between the catalytic layers; and
   forming a nanotube layer on the catalytic layer, wherein the nanotube layer is formed by reaction gases of hydrocarbon compound, $H_2$, nitride containing compound, and $SiH_4$.

24. The fabrication method for a selective nanotube layer according to claim 23, wherein the catalytic layer is a material selected from the group consisting of iron, nickel, cobalt, gold, platinum, and their metal ions.

25. The fabrication method for a selective nanotube layer according to claim 23, wherein the chemical vapor deposition includes microwave chemical vapor deposition with a microwave power of approximately 300 to 2000 watt.

26. The fabrication method for a selective nanotube layer according to claim 23, wherein the nanotube layer includes a boron nitride nanotube formed by a reaction gas selected from the group consisting of $B_2H_6/N_2$, $B_2H_6NH_3$ and $B(OCH_3)_3/N_2/H_2$.

27. The fabrication method for a selective nanotube layer according to claim 23, after the formation of the nanotube layer, further including conducting an annealing.

28. The fabrication method for a selective nanotube layer according to claim 27, wherein a gas used in the annealing is selected from the group consisting of $N_2$, $NH_3$, $NO$, $N_2O$, and $H_2$.

29. The fabrication method for a selective nanotube layer according to claim 27, between the steps of forming the nanotube layer and the annealing, further including conducting a fluorine ion implantation.

30. The fabrication method for a selective nanotube layer according to claim 27, wherein a source of the fluorine ion for the fluorine ion implantation is selected from the group consisting of $F^-$, $BF^{2+}$, and their combinations.

31. A damascene process comprising the steps of:
   providing a substrate;
   forming a metal catalytic layer on the substrate;
   patterning the metal catalytic layer to form a plurality of openings therein;
   cleaning-up a surface of the metal catalytic layer;
   forming a nanotube layer on the metal catalytic layer by chemical vapor deposition, wherein the nanotube layer is formed by reaction gases of hydrocarbon compound, $H_2$, nitride containing compound, and $SiH_4$;
   forming a barrier layer on the nanotube layer and the substrate; and
   forming a metal conductive layer in the openings.

32. The fabrication method for a damascene of a nanotube layer according to claim 31, wherein the metal catalytic layer is a material selected from the group consisting of iron, cobalt, nickel, gold, platinum, and their combinations.

33. The fabrication method for a damascene of a nanotube layer according to claim 31, wherein the chemical vapor deposition includes microwave chemical vapor deposition with a microwave power of approximately 330 to 2000 watt.

34. The fabrication method for a damascene of a nanotube layer according to claim 31, wherein the nanotube layer includes a boron nitride nanotube formed by a reaction gas selected from the group consisting of $B_2H_6/N_2$, $B_2H_6/NH_3$, and $B(OCH_3)_3/N_2/H_2$.

35. The fabrication method for a damascene of a nanotube layer according to claim 31, wherein the barrier layer is a material selected from the group consisting of Ti/TiN, Ta/TaN and WN.

36. The fabrication method of a damascene of a nanotube layer according to claim 31, wherein the metal conductive layer is a material selected from the group consisting of aluminum, copper, aluminum/copper alloy, and tungsten.

37. A damascene process comprising the steps of:
   providing a substrate;
   forming a patterned photoresist layer on the substrate;
   forming a plurality of metal catalytic layers on the photoresist layer and on an exposed portion of the substrate respectively;
   removing the photoresist layer and an overlying metal catalytic layer to form a plurality of openings on the substrate between the metal catalytic layers;
   forming a nanotube layer on the metal catalytic layer by chemical vapor deposition, wherein the nanotube layer is formed by reaction gases of hydrocarbon compound, $H_2$, nitride containing compound, and $SiH_4$;
   forming a barrier layer on the nanotube layer and the substrate; and
   forming a metal conductive layer in the openings.

38. The fabrication method for a damascene of a nanotube layer according to claim 37, wherein the metal catalytic layer is a material selected from the group consisting of iron, cobalt, nickel, gold, platinum and combinations of the group.

39. The fabrication method for a damascene of a nanotube layer according to claim 37, wherein the chemical vapor deposition includes microwave chemical vapor deposition with a microwave power of approximately 330 to 2000 watt.

40. The fabrication method for a damascene of a nanotube material according to claim 37, wherein the nanotube layer includes a boron nitride nanotube formed by a reaction gas selected from the group consisting of $B_2H_6/N_2$, $B_2H_6/NH_3$, and $B(OCH_3)_3/N_2/H_2$.

41. The fabrication method for a damascene of a nanotube layer according to claim 37, wherein the barrier layer is a material selected from the group consisting of Ti/TiN, Ta/TaN, and WN.

42. The fabrication method for a damascene of a nanotube layer according to claim 37, wherein the metal conductive layer is a material selected from the group consisting of aluminum, copper, aluminum/copper alloy, and tungsten.

* * * * *